United States Patent
Lee et al.

(10) Patent No.: US 7,892,924 B1
(45) Date of Patent: Feb. 22, 2011

(54) METHOD FOR MAKING A CHARGE BALANCED MULTI-NANO SHELL DRIFT REGION FOR SUPERJUNCTION SEMICONDUCTOR DEVICE

(75) Inventors: Yeeheng Lee, San Jose, CA (US); Moses Ho, Campbell, CA (US); Lingpeng Guan, Sunnyvale, CA (US)

(73) Assignee: Alpha and Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 12/629,793

(22) Filed: Dec. 2, 2009

(51) Int. Cl.
*H01L 21/336* (2006.01)
(52) U.S. Cl. .................. 438/268; 438/478; 257/24; 257/341; 257/E29.262; 257/E21.09; 257/E21.418
(58) Field of Classification Search ............. 438/268, 438/478; 257/24, 341, E29.262, E21.09, 257/E21.418, E29.257
See application file for complete search history.

(56) References Cited

U.S. PATENT DOCUMENTS

| | | | |
|---|---|---|---|
| 6,191,446 B1 * | 2/2001 | Gardner et al. ............... 257/330 |
| 6,621,132 B2 * | 9/2003 | Onishi et al. ................. 257/409 |
| 6,903,365 B1 * | 6/2005 | Nihei ........................... 257/14 |
| 6,982,459 B2 * | 1/2006 | Suzuki et al. ............... 257/329 |
| 7,141,866 B1 * | 11/2006 | Islam et al. ................. 257/628 |
| 7,176,524 B2 * | 2/2007 | Loechelt et al. ............. 257/341 |
| 7,283,388 B2 * | 10/2007 | Kang ........................... 365/175 |
| 7,554,155 B2 * | 6/2009 | Saito et al. .................. 257/341 |
| 7,585,718 B2 * | 9/2009 | Cho et al. .................... 438/197 |
| 7,799,633 B2 * | 9/2010 | Choi et al. ................... 438/253 |
| 2001/0041400 A1 * | 11/2001 | Ren et al. .................... 438/200 |
| 2003/0179559 A1 * | 9/2003 | Engelhardt et al. .......... 361/780 |
| 2005/0048701 A1 * | 3/2005 | Minato et al. ............... 438/135 |
| 2005/0242411 A1 * | 11/2005 | Tso ............................. 257/480 |
| 2006/0006458 A1 * | 1/2006 | Motai et al. ................. 257/330 |
| 2006/0249726 A1 * | 11/2006 | Choi et al. .................... 257/9 |
| 2007/0292987 A1 * | 12/2007 | Yoon et al. .................. 438/104 |
| 2008/0038850 A1 * | 2/2008 | Yamaguchi et al. .......... 438/17 |
| 2008/0246149 A1 * | 10/2008 | Kwak et al. ................. 257/751 |
| 2009/0075461 A1 * | 3/2009 | Ishida et al. ................. 438/492 |
| 2009/0085149 A1 * | 4/2009 | Ishida et al. ................. 257/499 |
| 2009/0186276 A1 * | 7/2009 | Zhamu et al. ............... 429/221 |
| 2009/0233415 A1 * | 9/2009 | Anderson et al. ........... 438/422 |
| 2010/0059814 A1 * | 3/2010 | Loechelt et al. ............. 257/330 |
| 2010/0163846 A1 * | 7/2010 | Yilmaz et al. ................. 257/24 |

* cited by examiner

*Primary Examiner*—N Drew Richards
*Assistant Examiner*—Ankush k Singal
(74) *Attorney, Agent, or Firm*—Chein-Hwa Tsao; C H Emily LLC (57) ABSTRACT

A method is disclosed for making a substantially charge balanced multi-nano shell drift region (MNSDR) for superjunction semiconductor devices atop a base substrate. The MNSDR has numerous concentric nano shell members $NSM_1, NSM_2, \ldots, NSM_M$ (M>1) of alternating, substantially charge balanced first conductivity type and second conductivity type and with height NSHT. First, a bulk drift layer (BDL) is formed atop the base substrate. A substantially vertical cavity of pre-determined shape and size and with depth NSHT is then created into the top surface of BDL. The shell members $NSM_1, NSM_2, \ldots, NSM_M$ are successively formed inside the vertical cavity, initially upon its vertical walls then moving toward its center, so as to successively fill the vertical cavity till a residual space remains therein. A semi-insulating or insulating fill-up nano plate is then formed inside the residual space to fill it up.

21 Claims, 12 Drawing Sheets

Present Invention

Fig. C1 Section A-A

Fig. C2

Fig. 1A Section E-E

Fig. 3A Present Invention

Fig. 3B Present Invention

Fig. 2A Present Invention

Fig. 2B Present Invention

Fig. 3C Present Invention

Fig. 3D Present Invention

Fig. 2C Present Invention

Fig. 2D Present Invention

Fig. 2E Present Invention

Fig. 3E Present Invention

Fig. 2F Present Invention

Fig. 3F Present Invention

Fig. 3G Present Invention

Fig. 2G Present Invention

METHOD FOR MAKING A CHARGE BALANCED MULTI-NANO SHELL DRIFT REGION FOR SUPERJUNCTION SEMICONDUCTOR DEVICE

CROSS REFERENCE TO RELATED APPLICATIONS

This application is related to the following commonly assigned patent applications, hereafter referred to as Hamza Applications:

U.S. application Ser. No. 12/139,164 filed on Dec. 31, 2008 entitled "NANO-TUBE MOSFET TECHNOLOGY AND DEVICES" by Hamza Yilmaz, Daniel Ng, Lingpeng Guan, Anup Bhalla, Wilson Ma, Moses Ho, John Chen U.S. application Ser. No. 12/484,166 filed on Jun. 12, 2009 entitled "Method for Forming Nanotube Semiconductor Devices" by Hamza Yilmaz, Xiaobin Wang, Anup Bhalla, John Chen, Hong Chang U.S. application Ser. No. 12/484,170 filed on Jun. 12, 2009 entitled "Nanotube Semiconductor Devices" by Hamza Yilmaz, Xiaobin Wang, Anup Bhalla, John Chen, Hong Chang whose content is incorporated herein by reference for any and all purposes.

FIELD OF INVENTION

This invention relates generally to the field of power semiconductor device structure and fabrication. More specifically, the present invention is directed to fabrication method for a power semiconductor device structure.

BACKGROUND OF THE INVENTION

Power MOSFET (metal-oxide-semiconductor field effect transistor) devices have many industrial applications, such as power amplifiers, power convertors, low noise amplifiers and digital Integrated Circuits (IC) to name a few. As a common element for a great variety of electronic products, the practitioners in the art of MOSFET device design and fabrication are constantly improving its performance parameters such as break down voltage Vbk, on-state resistance RD Son, device size and frequency response, to name a few.

FIG. A1 through FIG. A4 are excerpts from a prior art tutorial entitled "Superjunction devices & technologies—Benefits and Limitations of a revolutionary step in power electronics" by Dr. Gerald Deboy and Dr. Florin Udrea, published in EPE 2007—Aalborg, Denmark, 2-5 Sep. 2007. This tutorial dealt with an overview of the concept of employing superjunction devices to simultaneously improve Vbk and Rdson of a power MOSFET.

As originally invented at the beginning of 1980s, the drift region of a superjunction transistor device is formed of multiple, alternate n and p semiconductor stripes. Provided that the stripes are fairly narrow and the number of charge carriers within adjacent stripes are approximately equal, or so-called charge balanced, it is possible to deplete the stripes at relatively low voltages. Upon depletion, the stripes appear to be an 'intrinsic' layer and a near uniform electric field distribution is achieved, resulting in a high breakdown voltage. Both lateral superjunction devices (FIG. A1 and FIG. A2) and vertical superjunction devices (FIG. A3 and FIG. A4) can be manufactured using the superjunction concept. While the lateral devices tend to be more suitable for integration, the latter devices could be used for discrete devices. More specifically, FIG. A1 illustrates vertically stacked stripes in lateral configuration. FIG. A2 illustrates stripes arranged in the third dimension, called 3D Resurf in lateral configuration. FIG. A3 and FIG. A4 are arrangements suitable for vertical MOSFETs (Cool MOS, MDMesh). The most striking feature of all superjunction devices are their capability to break the limit line of silicon being imposed on conventional, non-superjunction devices. This limit is based on the need to serve with one degree of freedom namely the doping profile of the n-region the conflicting goals of high Vbk and low on-state-resistance. Superjunction devices add, due to their internal structure, a second degree of freedom namely the design and pitch of the additional p-columns. The former vertical electric field of the conventional, non-superjunction devices is therefore transformed into a three dimensional vectorial field with at least the theoretical capability to continuously reduce the RDSon by making the pitch of the p-columns smaller and smaller.

FIG. B1 through FIG. B3 illustrate numerous specific charge balanced stripe geometries and their method of making under additional prior arts. The method for making charge balanced vertical stripes of alternating conductivity types (p-type & n-type) of FIG. B1 is used by many companies. In this case, six (6) cycles each consists of an epitaxial growth and a multi-zone ion implantation are sequentially carried out atop a substrate (not shown here). Afterwards, a high temperature, long diffusion process is required to "expand" the multiple ion implantation zones to their final sizes. A typical diffusion process may require a temperature of 1150 degree C. for 6-10 hrs thus entailing an undesirable high thermal budget. In this illustrated example, cycle one epitaxial growth makes layer-1 1 and cycle one multi-zone ion implantation simultaneously makes implants 1a, 1b and 1c where layer-1 1 is of opposite conductivity type with respect to that of the implants 1a, 1b and 1c. For another example, cycle two epitaxial growth makes layer-2 2 and cycle two multi-zone ion implantation simultaneously makes implants 2a, 2b and 2c where layer-2 2 is of opposite conductivity type with respect to that of the implants 2a, 2b and 2c, etc. As a specific example, each of the epitaxial layers 1 through 6 is 5-7 micron in thickness and can be made of N− type while the implants 1a through 6c are made of P− type semiconductor material. In the end, the charge balanced vertical stripes correspond to column 10W, column 10A, column 10X, column 10B, column 10Y, column 10C and column 10Z. Another disadvantage of this method is, for charge balanced stripes of large height the number of cycles increases accordingly resulting in even slower production throughput and high cost of production.

The method for making charge balanced vertical stripes of alternating conductivity types (p-type & n-type) is shown FIG. B2. Here, a bulk semiconductor layer 20 can be epitaxially grown atop a substrate (not shown here). With photolithography and anisotropic etching numerous trenches 22a, 22b, 22c are made into the bulk semiconductor layer 20. Each trench has a trench depth D and trench width W with a corresponding aspect ratio A/R=D/W. The trenches 22a, 22b, 22c can then be filled up by epitaxially growing a fill semiconductor material 25 therein to fill in the entire deep trench, thus resulting in charge balanced columns 20W, 25A, 20X, 25B, 20Y, 25C and 20Z of alternating conductivity types. As a typical example, the substrate can be of N+ conductivity type, the bulk semiconductor layer 20 is N− of thickness 40-50 micron, trench width W is 4-6 micron while the fill semiconductor material 25 is P−. Consequently, the aspect ratio A/R can be very high (8-15) causing the appearance of numerous unfilled internal voids 26a, 26b, 26c in the fill semiconductor material 25. In turn, these internal voids can disturb charge balance and lead to undesirable low Vbk & high device leakage current.

FIG. B3 illustrates a third method for making charge balanced vertical stripes of alternating conductivity types disclosed by Hamza Yilmaz, et al. in U.S. application Ser. No. 12/319,164 filed Dec. 31, 2008. A bulk semiconductor layer 30 is epitaxially grown atop a highly doped bulk semiconductor layer 42. With photolithography and anisotropic etching a trench 32 is made into the bulk semiconductor layer 30. The trench 32 has a trench depth D and trench width W with a corresponding aspect ratio A/R=D/W. Nine (9) consecutive epitaxial layers of alternating, charge balanced conductivity types are grown on top forming layers 31a, 32b, 33a, 34b, 35a, 36b, 37a, 38b, 39a with a residual central space column. The central space column is then filled with the formation of a fill material 44 such as insulating oxide or intrinsic silicon whose charge balancing behavior is insensitive to any unfilled internal voids therein. A high temperature, long diffusion process is then carried out to propagate the dopants in the highly doped bulk semiconductor layer 42 into layers 31a-39a, hence dominating as a single conductivity type till a dopant diffusion front 48 (see bottom dashed line). Finally, a chemical mechanical polishing (CMP) process is carried out to remove the top horizontal portions of the layers 31a-39a and level the top surface (see top dashed line). As a typical example, the layers 31a-39a are each 1-2 micron thick. As before, the high temperature, long diffusion process entails an undesirable high thermal budget. In the end are left vertical charge balanced columns of alternating conductivity types.

In view of the above, there exists an ongoing need to improve the process of making high quality charge balanced drift region for superjunction semiconductor devices without incurring a high thermal budget and with higher production throughput.

SUMMARY OF THE INVENTION

A method is proposed for making a substantially charge balanced multi-nano shell drift region (MNSDR) for superjunction semiconductor device atop a base substrate of second conductivity type. The method does not incur a high thermal budget and it provides higher production throughput. The MNSDR has a nano shell set (NSS) with numerous concentric nano shell members $NSM_1$, $NSM_2$, ..., $NSM_i$, ..., $NSM_M$ (M>1) of alternating, substantially charge balanced first conductivity type and second conductivity type and with height NSHT. The method includes a) Form a bulk drift layer (BDL) atop the base substrate.
b) Create, into top surface of the BDL, a substantially vertical cavity of pre-determined shape and size and with depth NSHT.
c) Successively form inside the vertical cavity, initially upon its vertical walls then moving toward its center, the shell members $NSM_1$, $NSM_2$, ..., $NSM_M$ so as to successively fill the vertical cavity till a residual space remains therein.
d) Fill up the residual space by forming a semi-insulating or insulating fill-up nano plate therein.

In a more specific embodiment, the BDL can be formed by epitaxially growing the BDL with doping parameters corresponding to the conductivity type of BDL. Even more specifically, the BDL is formed with a very low doping concentration.

In an embodiment, the first conductivity type is N-type and the second conductivity type is P-type. In an alternative embodiment, the first conductivity type is P-type and the second conductivity type is N-type.

In a more specific embodiment, the superjunction semiconductor device is a diode or a transistor. The base substrate is a bi-layer made of a less highly doped semiconductor of second conductivity type atop a more highly doped semiconductor of second conductivity type. The shape of vertical cavity is rectangle, square, rhombus, hexagon, polygon, ellipse or circle. Even more specifically, the width of vertical cavity ranges from about 5 micron to about 40 micron and NSHT ranges from about 5 micron to about 50 micron.

In a first embodiment, the vertical cavity can be created by
  b1) Deposit a mask atop the BDL and open a window in the mask of shape and size equal to those of the vertical cavity.
  b2) Anisotropically etch, through the mask window, the BDL till a depth equal to NSHT.

Under the first embodiment, each $NSM_i$ can be formed by
  c1) Form, via selective epitaxial growth (SEG), a cavity-shaped doped epitaxial layer upon the vertical cavity while insuring that the doping parameters and thickness of the doped epitaxial layer correspond respectively to the conductivity type and shell thickness of the $NSM_i$.
  c2) Anisotropically etch away, through the mask window, the bottom portion of the doped epitaxial layer hence forming the $NSM_i$.

Under the first embodiment, the fill-up nano plate can be formed by forming, inside the residual space, a fill-up material whose charge balance property is insensitive to internal voids formation typically observed under a high aspect ratio of the residual space thus avoiding disturbance to charge balance of the MNSDR. The windowed mask can then be removed from the top of the MNSDR. In a more specific embodiment, the host semiconductor material for both base substrate and BDL is silicon and the fill-up material is silicon oxide or intrinsic silicon.

In a second embodiment, the vertical cavity can be created by
  b1) Deposit a mask atop the BDL and open a window in the mask of shape and size equal to those of the vertical cavity.
  b2) Anisotropically etch, through the mask window, the BDL till a depth equal to NSHT.
  b3) Remove the windowed mask.

Under the second embodiment, each $NSM_i$ can be formed by
  c1) Form, via epitaxial growth (EPG), a cavity-shaped doped epitaxial layer upon the vertical cavity while insuring that the doping parameters and thickness of the doped epitaxial layer correspond respectively to the conductivity type and shell thickness of the $NSM_i$.
  c2) Anisotropically etch away, through the mask window, the bottom portion and the top horizontal portion of the doped epitaxial layer hence forming the $NSM_i$.

Under the second embodiment, the fill-up nano plate can be formed by forming, inside the residual space, a fill-up material whose charge balance property is insensitive to internal voids formation typically observed under a high aspect ratio of the residual space thus avoiding disturbance to charge balance of the MNSDR. In a more specific embodiment, the host semiconductor material for both base substrate and BDL is silicon and the fill-up material is silicon oxide or intrinsic silicon.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIG. A1 through FIG. A4 illustrate various charge balanced stripe configurations excerpted from a published prior art tutorial.

FIG. B1 through FIG. B3 illustrate numerous specific charge balanced stripe geometries and their method of making under additional prior arts.

FIG. C1 through FIG. C3 illustrate another example of charge balanced vertical stripe superjunction structure and its associated multiple MOSFETs.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

FIG. C1 through FIG. C3 illustrate another example of charge balanced vertical stripe superjunction structure 60 and its associated multiple MOSFETs with superjunction structure 90. The vertical stripe superjunction structure 60 has a multi-nano stripe drift region 68 bounded, along X-direction, by an N—bulk drift layer (BDL) 66 with both being built upon a bi-layer having an N buffer layer 64 atop an N+ base substrate 62. In an alternative embodiment, the N buffer layer 64 may be omitted. The multi-nano stripe drift region 68 is a linear array of contiguous charge balanced stripes of alternating conductivity types N stripe 71, P stripe 72, N stripe 73, P stripe 74, . . . , P stripe 84, N stripe 83, P stripe 82, N stripe 81. Notice that a fill-up oxide stripe 80 is interposed in the middle of the linear array. Alternatively the fill-up oxide stripe 80 may be replaced with another material of very low charge, such as intrinsic silicon. The dopant concentrations of the individual P/N stripes are given in dopants per $cm^2$. This is the concentration within that stripe per unit surface area at the interface between one stripe and the next. For example, if the P stripe 82 has a width (X-direction) of 0.25 micron and a concentration of $2E12\text{-}cm^{-2}$, then its equivalent volumetric P-doping concentration is $8E16\text{-}cm^{-3}$, etc.

It is important to point out that, referencing Section A-A of FIG. C1, the detailed geometrical structure and dopant concentration profile of the multi-nano stripe drift region 68 exhibit a mirror symmetry with respect to the fill-up oxide stripe 80. For example, N stripe 79 mirrors N stripe 89, P stripe 78 mirrors P stripe 88, N stripe 73 mirrors N stripe 83, etc. This is because the multi-nano stripe drift region 68 is fabricated, under the present invention, by a number of contiguous, concentric nano shell members with the outermost member being made of (N stripe 71, N stripe 81), the next member being made of (P stripe 72, P stripe 82), . . . , the innermost being made of (N stripe 79, N stripe 89). The fabrication process will be presently described in more detail. Following the completion of the vertical stripe superjunction structure 60, the rest of a multiple MOSFETs with superjunction structure 90 can be made with numerous processes known in the art and this is illustrated in FIG. C3. As for example, rows of MOSFETs may be formed along the X-direction so that they are perpendicular to the multi-nano stripe drift region 68 which runs in the Y direction. MOSFETs with superjunction structure 90 has gate electrode 92b, gate oxide 92c, N+ source 92a, P– body 92d, P+ body contact 92e. In this case, the MOSFET shown is a n-channel MOSFET and so the N stripes 71, 73, . . . , 89 act as the drain drift region, while the N+ substrate 62 acts as the drain.

Figure 1A:
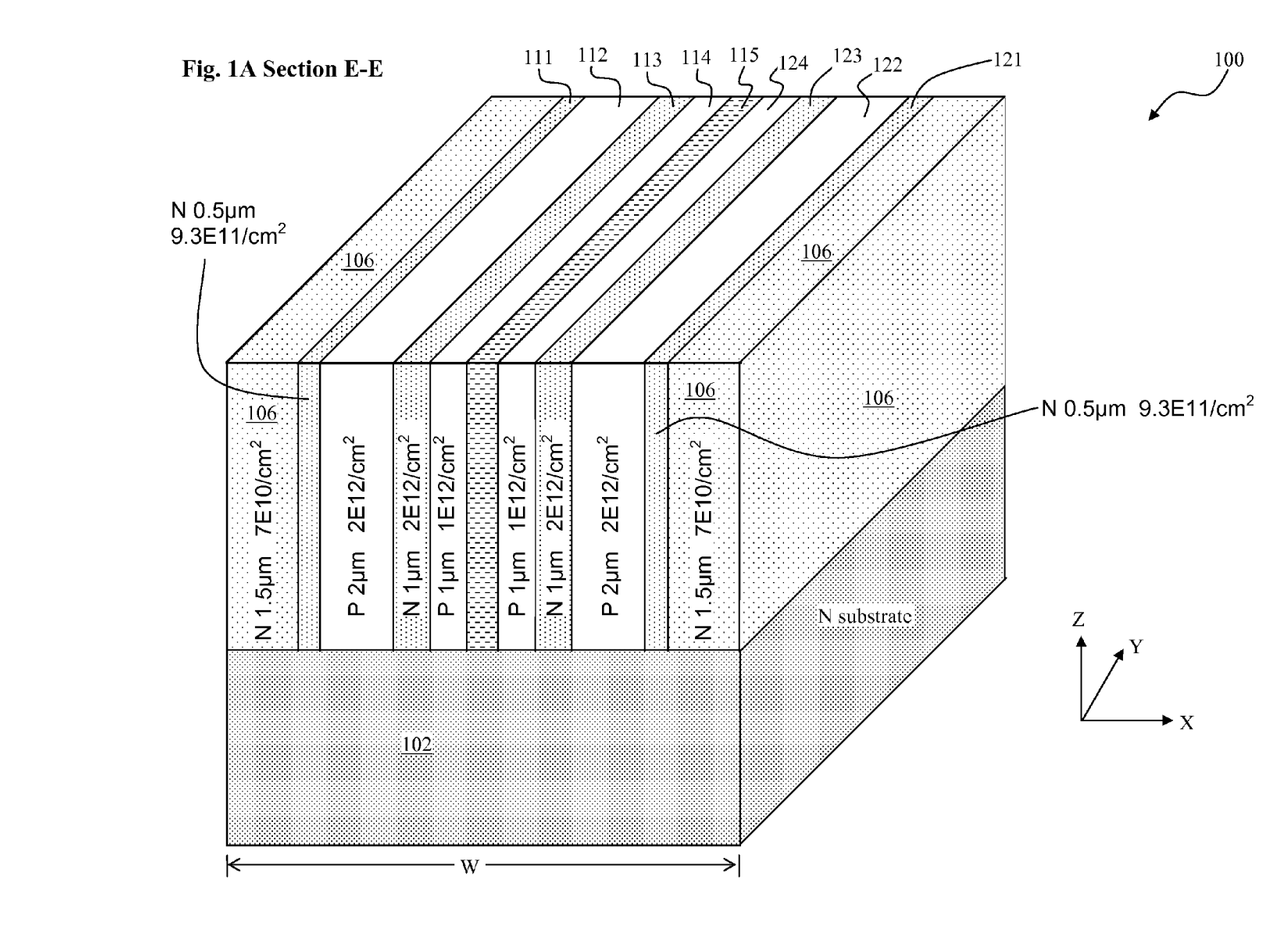
FIG. 1A through FIG. 1C illustrate a variety of multi-nano shell drift region superjunction structures under the present invention.
Figure 1B:
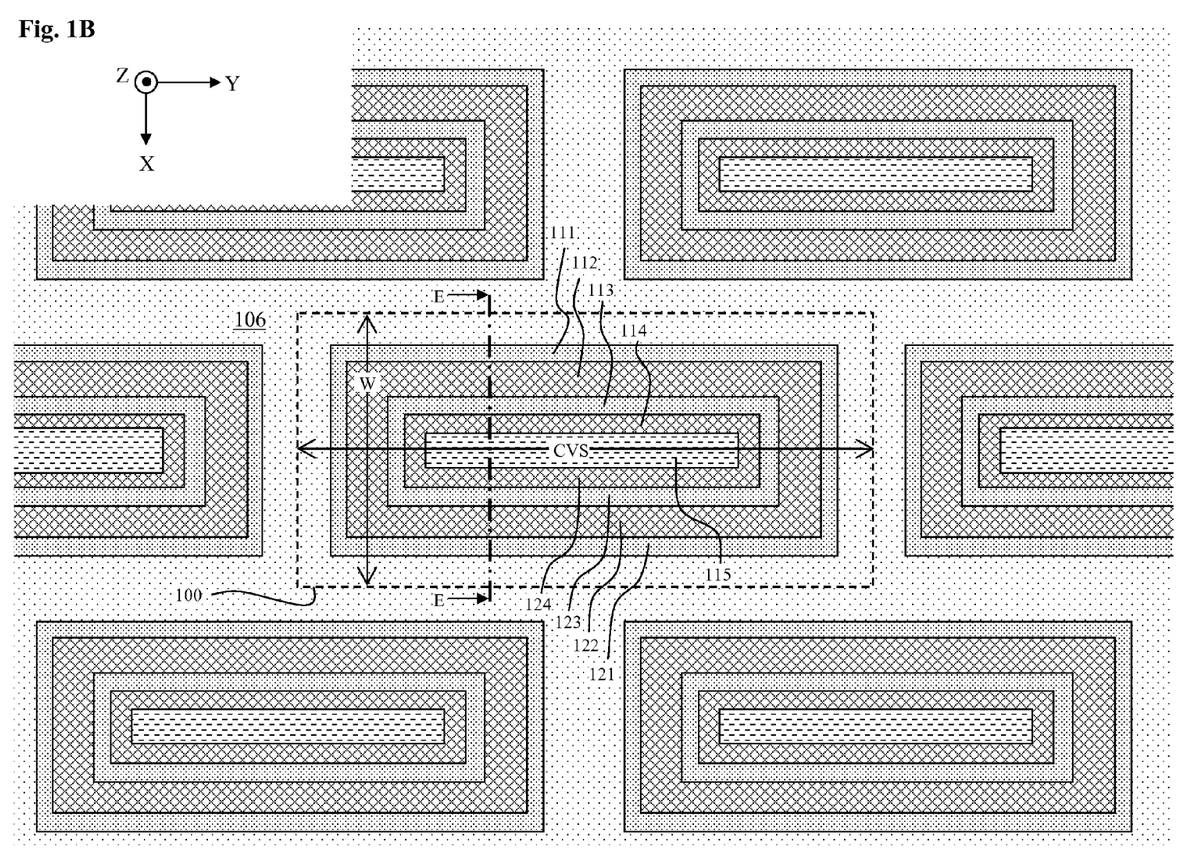
Figure 1C:
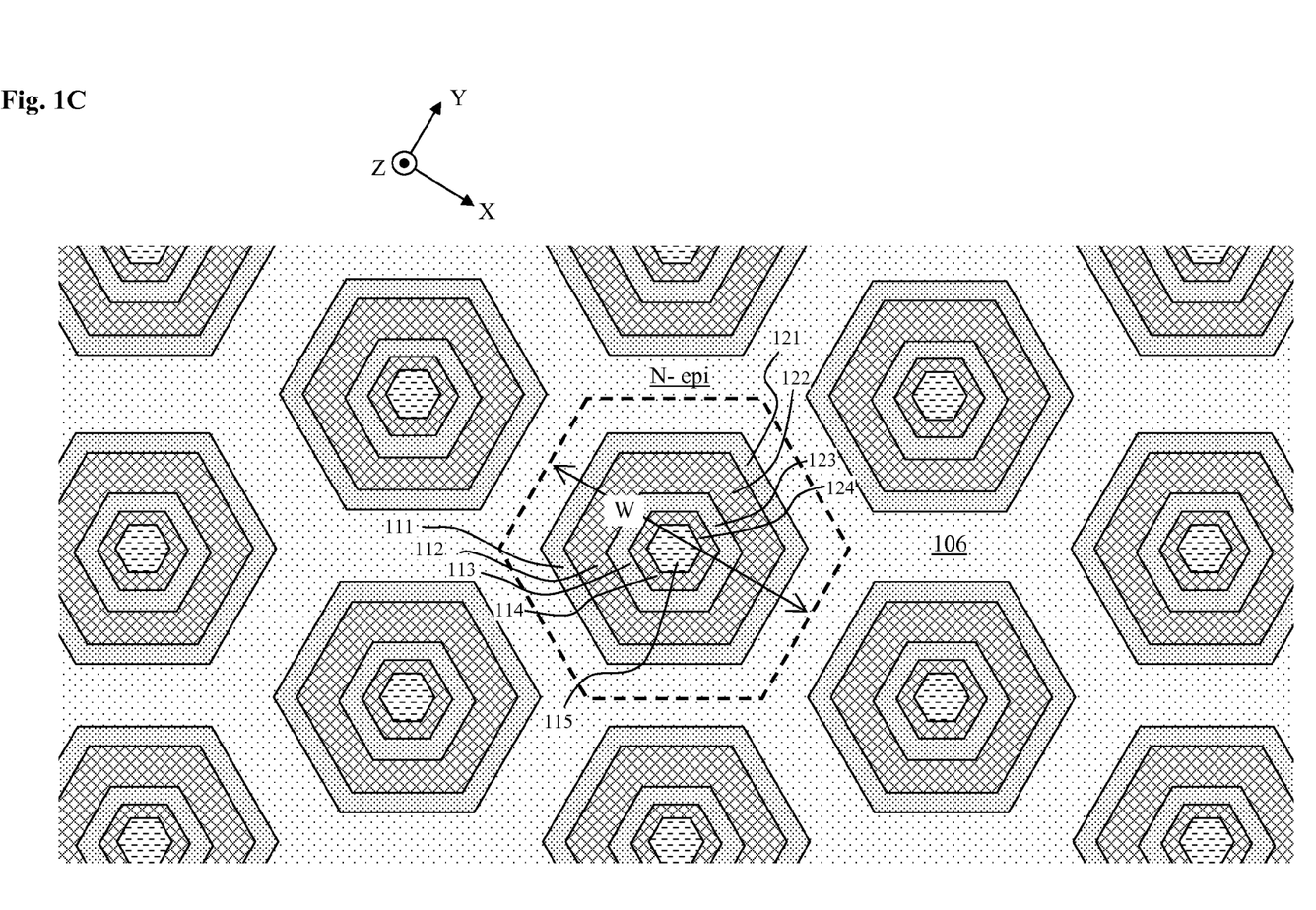

FIG. 1A through FIG. 1C illustrate a few multi-nano shell drift region (MNSDR) alternative embodiments of the superjunction structures. The MNSDR superjunction structure 100 shown in FIG. 1A (perspective with E-E sectional view of FIG. 1B) and FIG. 1B (top view, multiple units of MNSDR superjunction structure 100) is bounded by an N– epi BDL 106 and built upon an N base substrate 102. Four contiguous, concentric nano shell members are, counting from the outside edge of MNSDR superjunction structure 100 inwards, (N stripe 111, N stripe 121), (P stripe 112, P stripe 122), (N stripe 113, N stripe 123) and (P stripe 114, P stripe 124). More specifically, the shell member (N stripe 113, N stripe 123) has a width (X-direction) of 1 micron with an N type dopant concentration of $2E12\text{-}cm^{-2}$, etc. In this example, the shape of the nano shell members is rectangular (FIG. 1B). Notice that a fill-up oxide stripe 115 is interposed in the middle of the linear array. The MNSDR 100 is basically the same as the multi-nano stripe drift region 68, but has a simpler design which may be easier to manufacture. The MNSDR may continue in a stripe in the Y direction or form closed structures such as rectangles (FIG. 1B) or hexagons (FIG. 1C). Each MNSDR superjunction structure unit 100 has a width W. The length of the stripes in the X-Y plane defines a cavity size (CVS). The MNSDR superjunction structure 100 shown in FIG. 1C (top view, multiple units of MNSDR superjunction structure 100) has a width W in the X-Y plane across all its sides. The shape of the nano shell members in FIG. 1C is hexagonal.

Figure 2A:
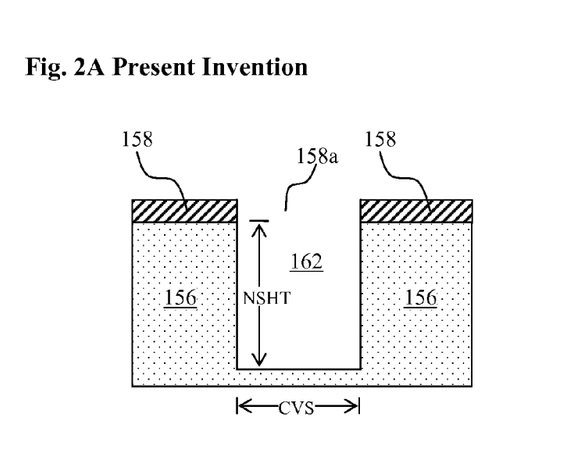
FIG. 2A through FIG. 2G illustrate a first embodiment method of making the multi-nano shell drift region under the present invention.

FIG. 2A through FIG. 2G illustrate a first embodiment method of making the MNSDR under the present invention. In FIG. 2A a BDL 156 is formed. In one embodiment, the BDL 156 may be formed atop a base substrate (not shown here to avoid unnecessary obscuring details). In another alternative embodiment, a buffer layer may be formed between the BDL and the base substrate. As an example, the BDL 156 can be formed by epitaxially growing the BDL 156 with doping parameters known in the art and corresponding to a desired conductivity type and dopant concentration. As a more specific example, the BDL 156 can be formed with a very low N– dopant volumetric concentration in the range of from about 1E14-cm-3 to about 1E16-cm-3. A cavity hard mask 158 is then applied atop the BDL 156 and opened with a mask window 158a of pre-determined shape and size CVS. The BDL 156 is then anisotropically etched through the mask window 158a to create a substantially vertical cavity 162 with a depth NSHT. As an application example, CVS can range from about 5 microns to about 40 microns while NSHT can range from about 5 microns to about 50 microns. It should be pointed out that, in practice, the "substantially vertical" walls of the vertical cavity 162 may have a taper of around five (5) degrees from the vertical.

Figure 2B:
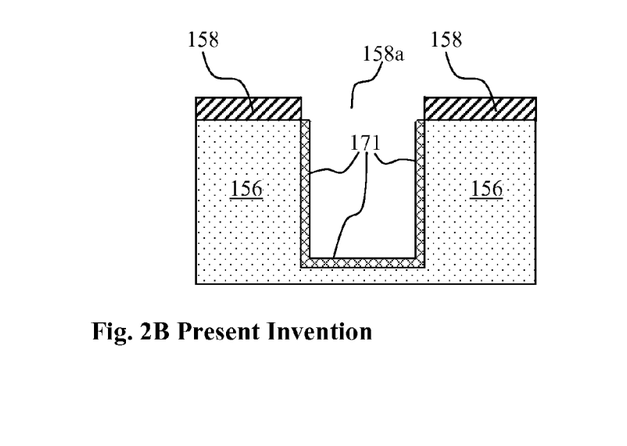
Figure 2C:
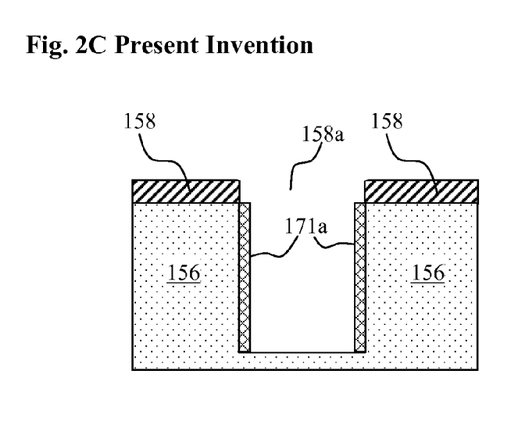
Figure 2D:
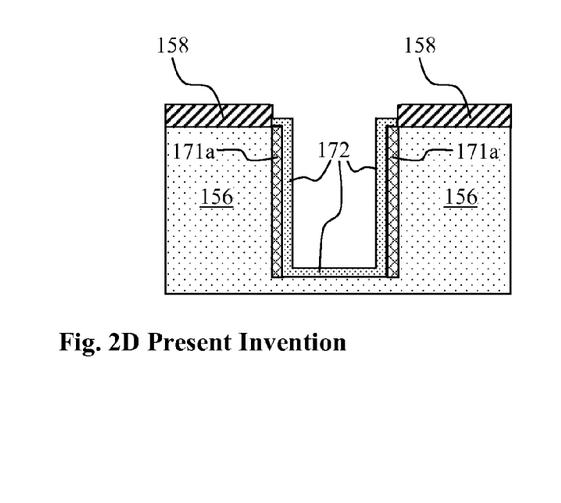
Figure 2E:
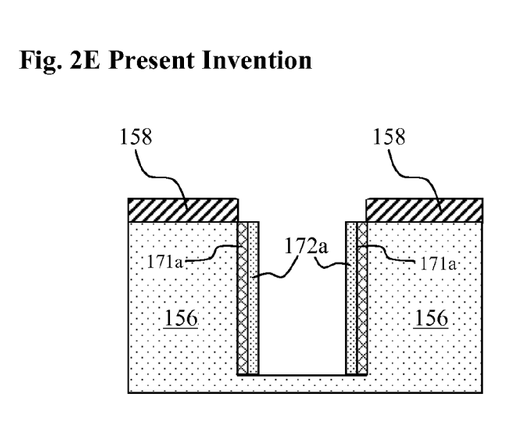
Figure 2F:
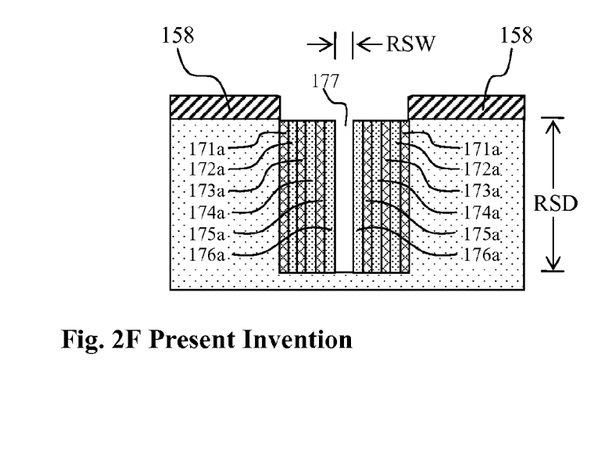

In FIG. 2B, a cavity-shaped doped epitaxial layer-1 171 is formed, via selective epitaxial growth (SEG) through the mask window 158*a*, upon the vertical cavity 162 while insuring that the doping parameters and thickness of the doped epitaxial layer-1 171 correspond respectively to the desired conductivity type and shell thickness of the outermost nano shell member. In FIG. 2C, the bottom portion of the just formed doped epitaxial layer-1 171 is anisotropically etched away, through the mask window 158*a*, hence forming a nano shell member (NSM1) 171*a*. From FIG. 2D through FIG. 2E the same steps illustrated in FIG. 2B and FIG. 2C are repeated to form a cavity-shaped doped epitaxial layer-2 172 and then a nano shell member (NSM2) 172*a*. The same steps are then repeated to successively form, inside the vertical cavity 162, additional nano shell members (NSM3) 173*a*, NSM4 174*a*, NSMS 175*a* and NSM6 176*a* so as to successively fill the vertical cavity 162 till a residual space 177 of residual space depth RSD and residual space width RSW remains therein. The thus fabricated NSM1 171*a* through NSM6 176*a* form a number of contiguous, concentric nano shell members and are illustrated in FIG. 2F. Furthermore, to realize a substantially charge balanced MNSDR, the NSM1 171*a* through NSM6 176*a* are formed of alternating, substantially charge balanced first conductivity type and second conductivity type semiconductor materials. NSM1 171*a* through NSM6 176*a* are formed with appropriate conductivity type, doping concentration and width to achieve substantial charge balance.

Figure 2G:
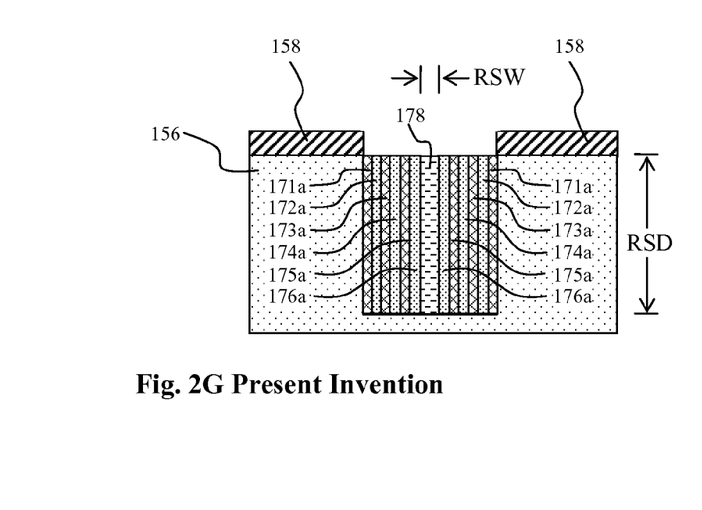

In FIG. 2G, the residual space 177 is filled up with the formation of a semi-insulating or insulating fill-up nano plate 178 therein, for example a fill-up oxide nano plate 178 as illustrated. Alternatively the fill-up nano plate could be intrinsic silicon/semiconductor material. Notice the high aspect ratio RSD/RSW of the fill-up oxide nano plate 178. While internal voids formation are typically observed inside the fill-up oxide nano plate 178 with such a high aspect ratio, the usage of semi-insulating or insulating fill-up materials therein makes the resulting charge balance property of the MNSDR insensitive to such internal voids. As a more specific embodiment, the host semiconductor material for both base substrate and the BDL 156 is silicon and the fill-up material is silicon oxide or intrinsic silicon. Afterwards, the windowed cavity mask 158 is removed from the top of the MNSDR (not shown).

Figure 3A:
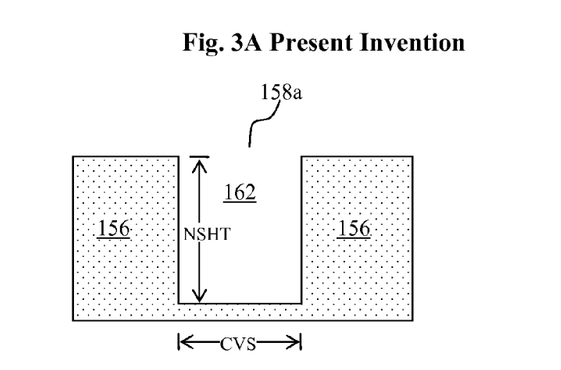
FIG. 3A through FIG. 3G illustrate a second embodiment method of making the multi-nano shell drift region under the present invention.

FIG. 3A through FIG. 3G illustrate a second embodiment method of making the MNSDR under the present invention similar to the method illustrated in FIG. 2A through FIG. 2G. However in FIG. 3A through FIG. 3G, a hard mask is not used during the growing of the NSM's. In FIG. 3A a BDL 156 is formed atop a base substrate (not shown here to avoid unnecessary obscuring details). The BDL 156 can be formed by epitaxially growing the BDL 156 with doping parameters known in the art and corresponding to a desired conductivity type and dopant concentration. A cavity mask 158 is then applied atop the BDL 156 and opened with a mask window 158*a* of pre-determined shape and size CVS. The BDL 156 is then anisotropically etched through the mask window 158*a* to create a substantially vertical cavity 162 with a depth NSHT. As pointed out before, in practice, the "substantially vertical" walls of the vertical cavity 162 has a taper of around five (5) degrees from the vertical. The windowed cavity mask 158 is then completely removed, as shown in FIG. 3A.

Figure 3B:
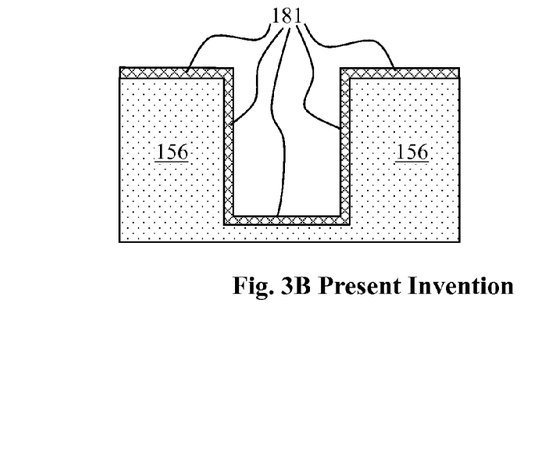
Figure 3C:
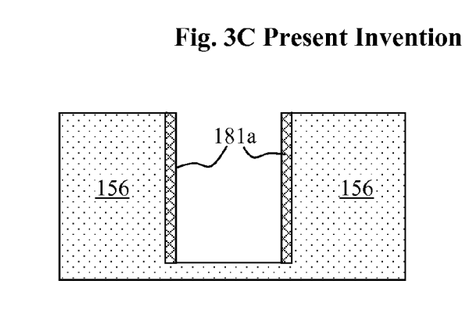
Figure 3D:
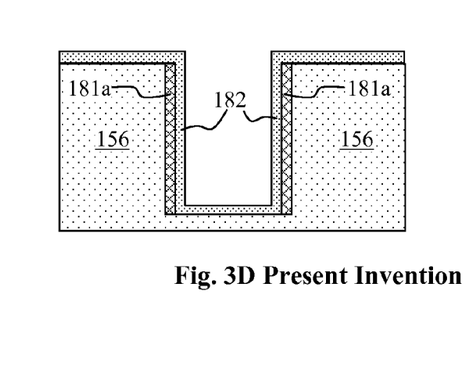
Figure 3E:
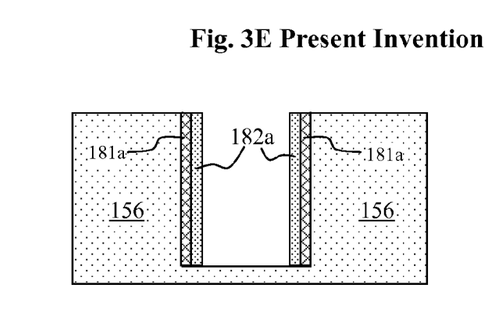
Figure 3F:
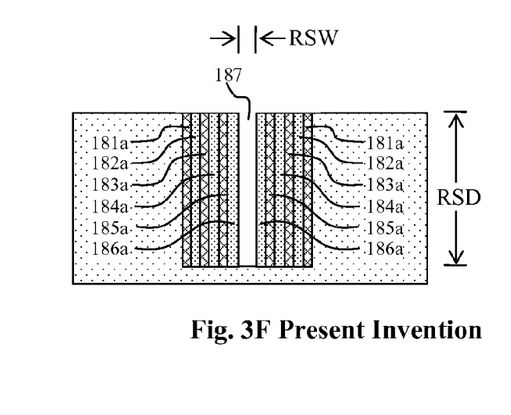

In FIG. 3B, a doped epitaxial layer-1 181 with a cavity-shaped central portion is formed via epitaxial growth (EPG) atop while insuring that the doping parameters and thickness of the doped epitaxial layer-1 181 correspond respectively to the desired conductivity type and shell thickness of the outermost nano shell member. The doped epitaxial layer-1 181 is non-selectively grown on all exposed semiconductor surfaces. In FIG. 3C, the horizontal surface portions of the just formed doped epitaxial layer-1 181 are anisotropically etched away thus forming a nano shell member ($NSM_1$) 181*a*. From FIG. 3D through FIG. 3E the same steps illustrated in FIG. 3B and FIG. 3C are repeated to form a doped epitaxial layer-2 182 and then a nano shell member ($NSM_2$) 182*a*. The same steps are then repeated to successively form, inside the vertical cavity 162, additional nano shell members $NSM_3$ 183*a*, $NSM_4$ 184*a*, $NSM_5$ 185*a* and $NSM_6$ 186*a* so as to successively fill the vertical cavity 162 till a residual space 187 of residual space depth RSD and residual space width RSW remains therein. The thus fabricated NSM1 181*a* through NSM6 186*a* form a number of contiguous, concentric nano shell members and are illustrated in FIG. 3F. Furthermore, to realize a substantially charge balanced MNSDR, the NSM1 181*a* through NSM6 186*a* are formed of alternating, substantially charge balanced first conductivity type and second conductivity type semiconductor materials.

Figure 3G:
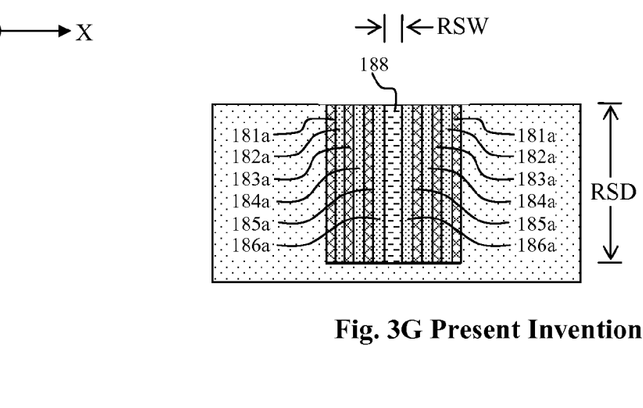

In FIG. 3G, the residual space 187 is filled up with the formation of a semi-insulating or insulating fill-up nano plate therein, for example a fill-up oxide nano plate 188 as illustrated. Notice the high aspect ratio RSD/RSW of the fill-up oxide nano plate 188. While internal voids formation are typically observed inside the fill-up oxide nano plate 188 with such a high aspect ratio, the usage of semi-insulating or insulating fill-up materials therein makes the resulting charge balance property of the MNSDR insensitive to such internal voids. The NSM members may continue as rows in the Y-direction, or formed closed structures like those shown in FIG. 1B and FIG. 1C.

A method has been invented for making a substantially charge balanced MNSDR for superjunction semiconductor device atop a base substrate. Referring to FIG. 2F and FIG. 3F, as the various charge balanced vertical stripes within the vertical cavity 162 are fabricated in pairs the corresponding process throughput is accordingly increased. Additionally, the present invention method does not require an undesirable high temperature, long diffusion process entailing high thermal budget. Furthermore, the charge balance property of the resulting MNSDR is not disturbed by internal voids formation typically observed inside the fill-up nano plate that would otherwise affect the fabrication process yield. While the present invention has been described with examples of vertical cavity shape like rectangle and hexagon, by now it should become clear to those skilled in the art that the present invention method expects to be applicable to a wide variety of other shapes such as square, rhombus, polygon, rows, ellipse or circle, etc. The NSM's may also be formed with varying widths, and doping concentrations, so long as they are made to charge balance with their adjacent regions.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

The invention claimed is:

1. A method for making a substantially charge balanced multi-nano shell drift region (MNSDR) for superjunction semiconductor device atop a base substrate of second conductivity type, the MNSDR having a nano shell set (NSS) with a plurality of concentric nano shell members $NSM_1$, $NSM_2, \ldots, NSM_i, \ldots, NSM_M$ (M>1) of alternating, substantially charge balanced first conductivity type and second conductivity type and with height NSHT, the method comprises:
   a) providing the base substrate and forming a bulk drift layer (BDL) atop;
   b) creating, into top surface of the BDL, a substantially vertical cavity of pre-determined shape and size and with depth NSHT;
   c) successively forming inside the vertical cavity, initially upon its vertical walls then moving toward its center, the shell members $NSM_1$, $NSM_2, \ldots, NSM_M$ so as to successively fill the vertical cavity till a residual space remains therein; and
   d) filling up the residual space by forming a semi-insulating or insulating fill-up nano plate therein.

2. The method of claim 1 wherein forming the BDL comprises epitaxially growing the BDL with doping parameters corresponding to the conductivity type of BDL.

3. The method of claim 1 wherein forming the BDL further comprises forming it with a very low doping concentration.

4. The method of claim 1 wherein creating the vertical cavity comprises:
   b1) depositing a mask atop the BDL and opening a window in the mask of shape and size equal to those of the vertical cavity; and
   b2) anisotropically etching, through the mask window, the BDL till a depth equal to NSHT.

5. The method of claim 1 wherein creating the vertical cavity comprises:
   b1) depositing a mask atop the BDL and opening a window in the mask of shape and size equal to those of the vertical cavity;
   b2) anisotropically etching, through the mask window, the BDL till a depth equal to NSHT; and
   b3) removing the windowed mask.

6. The method of claim 1 wherein the base substrate is a bi-layer made of a less highly doped semiconductor of second conductivity type atop a more highly doped semiconductor of second conductivity type.

7. The method of claim 1 wherein the shape of vertical cavity is rectangle, square, rhombus, hexagon, polygon, ellipse or circle.

8. The method of claim 1 wherein the superjunction semiconductor device is a diode or a transistor.

9. The method of claim 1 wherein the width of vertical cavity ranges from about 5 microns to about 40 microns and NSHT ranges from about 5 microns to about 50 microns.

10. The method of claim 4 wherein forming the $NSM_i$ comprises:
    c1) forming, via selective epitaxial growth (SEG), a cavity-shaped doped epitaxial layer upon the vertical cavity while insuring that the doping parameters and thickness of the doped epitaxial layer correspond respectively to the conductivity type and shell thickness of the $NSM_i$; and
    c2) anisotropically etching away, through the mask window, the bottom portion of the doped epitaxial layer hence forming the $NSM_i$.

11. The method of claim 10 wherein forming the fill-up nano plate comprises forming, inside the residual space, a fill-up material whose charge balance property is insensitive to internal voids formation typically observed under a high aspect ratio of the residual space whereby avoiding disturbance to charge balance of the MNSDR.

12. The method of claim 11 wherein the host semiconductor material for both base substrate and BDL is silicon and the fill-up material is silicon oxide or intrinsic silicon.

13. The method of claim 11 further comprises removing the windowed mask from the top of the MNSDR.

14. The method of claim 5 wherein forming the $NSM_i$ comprises:
    c1) forming, via epitaxial growth (EPG), a cavity-shaped doped epitaxial layer atop while insuring that the doping parameters and thickness of the doped epitaxial layer correspond respectively to the conductivity type and shell thickness of the $NSM_i$; and
    c2) anisotropically etching away the horizontal surface portions of the doped epitaxial layer hence forming the $NSM_i$.

15. The method of claim 14 wherein forming the fill-up nano plate comprises forming, inside the residual space, a fill-up material whose charge balance property is insensitive to internal voids formation typically observed under a high aspect ratio of the residual space whereby avoiding disturbance to charge balance of the MNSDR.

16. The method of claim 15 wherein the host semiconductor material for both base substrate and BDL is silicon and the fill-up material is silicon oxide or intrinsic silicon.

17. A method of forming a substantially charge balanced multi-nano shell drift region (MNSDR) on a semiconductor substrate for superjunction semiconductor device, the MNSDR having a nano shell set (NSS) within a bulk drift layer (BDL) with a plurality of concentric nano shell members $NSM_1$, $NSM_2, \ldots, NSM_i, \ldots, NSM_M$ (M>1) of alternating, substantially charge balanced first conductivity type and second conductivity type, the bottom of the nano shell members electrically contacting the semiconductor substrate, the method comprises:
   a) forming a bulk drift layer (BDL);
   b) forming a trench in the BDL;
   c) epitaxially growing a nano shell member $NSM_i$ in the trench, wherein the thickness and dopant concentration of $NSM_i$ are selected so that the $NSM_i$ will be substantially charge balanced with its adjacent regions;
   d) anisotropically etching $NSM_i$ to remove its horizontal portions such that $NSM_i$ remains on the sidewalls of the trench; and
   e) repeating steps c) and d) until completion of the NSS with a residual space remaining in the trench.

18. The method of claim 17 further comprises, after step e):
   f) filling up the residual space by forming a semi-insulating or insulating fill-up nano plate therein.

19. The method of claim 17 wherein the superjunction semiconductor device is a diode or a field effect transistor.

20. A method of forming a substantially charge balanced multi-nano shell drift region (MNSDR) on a semiconductor substrate of second conductivity type for superjunction semiconductor device, the MNSDR having a nano shell set (NSS) within a bulk drift layer (BDL) with a plurality of concentric nano shell members $NSM_1$, $NSM_2, \ldots, NSM_i, \ldots, NSM_M$ (M>1) of alternating, substantially charge balanced first conductivity type and second conductivity type, the bottom of the nano shell members electrically contacting the semiconductor substrate, the method comprises:
 a) forming a bulk drift layer (BDL);
 b) forming a trench in the BDL;
 c) concentrically growing the NSS within the trench, wherein prior to growing an NSM of second conductivity type on an NSM of first conductivity type, the NSM of first conductivity type is anisotropically etched to remove its bottom portions; and
 d) repeating step c).

21. The method of 20 further comprising:
 e) filling up the residual space in the trench by forming a semi-insulating or insulating fill-up nano plate therein.

* * * * *